(12) United States Patent
Lin

(10) Patent No.: US 12,732,136 B2
(45) Date of Patent: Sep. 8, 2026

(54) LOW-NOISE CRYSTAL OSCILLATOR USING SELF-TIMED INTERMITTENT DC COUPLING FOR BIASING

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 18/985,415

(22) Filed: Dec. 18, 2024

(65) Prior Publication Data

US 2026/0171968 A1 Jun. 18, 2026

(51) Int. Cl.
*H03B 5/36* (2006.01)
*H03B 5/24* (2006.01)

(52) U.S. Cl.
CPC ............... *H03B 5/364* (2013.01); *H03B 5/24* (2013.01); *H03B 2200/0088* (2013.01)

(58) Field of Classification Search
CPC ... H03B 5/364; H03B 5/24; H03B 2200/0088
See application file for complete search history.

(56) References Cited

U.S. PATENT DOCUMENTS 10,666,197 B1 * 5/2020 Lin ........................ H03B 5/364
2008/0238561 A1 * 10/2008 Otsuka .................. H03B 5/364 331/158

* cited by examiner

*Primary Examiner* — Jeffrey M Shin
(74) *Attorney, Agent, or Firm* — McClure, Qualey & Rodack, LLP

(57) ABSTRACT

A crystal oscillator having a PMOS, an NMOS transistor, a feedback capacitor positioned between the source node and one of the first gate node and the second gate node; a shunt capacitor positioned between the source node and one of the power supply node and the ground node, an AC coupling capacitor positioned between the first gate node and the second gate node, and a crystal positioned between one of the first gate node and the second gate node and one of the ground node and the power supply node. A first DC coupling network couples a first bias node to the first gate node according to a state of a first gate voltage at the first gate node, and a second DC coupling network couples a second bias node to the second gate node according to a state of a second gate voltage at the second gate node.

3 Claims, 2 Drawing Sheets

LOW-NOISE CRYSTAL OSCILLATOR USING SELF-TIMED INTERMITTENT DC COUPLING FOR BIASING

BACKGROUND OF THE DISCLOSURE

Field of the Disclosure

The present disclosure generally relates to crystal oscillator, and particularly to crystal oscillator that utilize self-timed intermittent DC coupling to mitigate noise.

Description of Related Art

In the present disclosure, a signal is defined as a voltage of a variable level that carries specific information and may vary over time. The level of the signal at any given moment indicates its state at that moment. A logical signal is characterized by two states: a low state and a high state; the logical signal is deemed high when its voltage level exceeds a predetermined trip point and low otherwise. In reference to a logical signal Q, the phrase "Q is high" or "Q is low" implies "Q is in the high state" or "Q is in the low state," respectively. It is noted that the trip point of a first logical signal may differ from that of a second logical signal.

A clock signal, herein referred to as a "clock," is defined as a logical signal that cyclically transitions between a low state and a high state. A clean clock signal is characterized by consistent periodicity in the transitions between the low state and the high state, while noise in the clock signal disrupts this periodicity.

Crystal oscillators that can generate a clean clock signal with very low noise are highly desirable. FIG. 1 illustrates a schematic diagram of a prior art crystal oscillator 100, as disclosed by Lin in U.S. Pat. No. 10,666,197, comprising a crystal 120, a PMOS (p-channel metal-oxide semiconductor) transistor 111, an NMOS (n-channel metal-oxide semiconductor) transistor 112, three capacitors 141, 142, and 143, and two resistors 131 and 132. The crystal 120 determines the oscillation frequency of the oscillation signal VOSC, which is a clean and periodic signal that can be used as a clock. Capacitor 142 provides strong AC (alternate current) between the gates of NMOS transistor 112 and PMOS transistor 111, which, along with capacitors 141 and 143, establish a negative resistance presented to the oscillation signal VOSC to sustain the oscillation. Resistors 131 and 132 provide DC coupling from a first bias node VB131 and a second bias node VB132 to the gates of PMOS transistor 111 and NMOS transistor 112, respectively, to establish a proper biasing condition. The crystal oscillator 100 can generate a low-noise clock primarily due to the NMOS transistor 111 and PMOS transistor 112 jointly and coherently function as a regenerative circuit, thus proving superior to prior art that employs only a single PMOS transistor or NMOS transistor for this purpose. However, the crystal oscillator 100 has a drawback in that the two resistors 131 and 132 become significant noise contributors, potentially introducing noise to the oscillation signal VOSC.

What is desired is a crystal oscillator that not only uses both an NMOS transistor and a PMOS transistor to provide a regeneration function but also one that can mitigate noise contribution from a biasing circuit.

BRIEF DESCRIPTION OF THIS DISCLOSURE

An objective of this present invention is to use both a PMOS transistor and NMOS transistor to jointly and coherently function as a regenerative network to establish an oscillation using a biasing scheme that utilizes a DC (direct current) coupling that is synchronized with the oscillation in an intermittent manner to reduce noise contribution.

In one embodiment, a crystal oscillator comprises: a PMOS (p-channel semiconductor) transistor having its gate, source, and drain terminals connected to a first gate node, a source node, and a ground node, respectively; an NMOS (n-channel metal-oxide semiconductor) transistor having its gate, source, and drain terminals connected to a second gate node, the source node, and a power supply node, respectively; a feedback capacitor positioned between the source node and one of the first gate node and the second gate node; a shunt capacitor positioned between the source node and one of the power supply node and the ground node; an AC (alternating current) coupling capacitor positioned between the first gate node and the second gate node; a crystal positioned between one of the first gate node and the second gate node and one of the ground node and the power supply node; a first DC (direct current) coupling network configured to couple a first bias node to the first gate node in accordance with a state of a first gate voltage at the first gate node; and a second DC coupling network configured to couple a second bias node to the second gate node in accordance with a state of a second gate voltage at the second gate node.

DETAILED DESCRIPTION OF THIS DISCLOSURE

Figure 1:
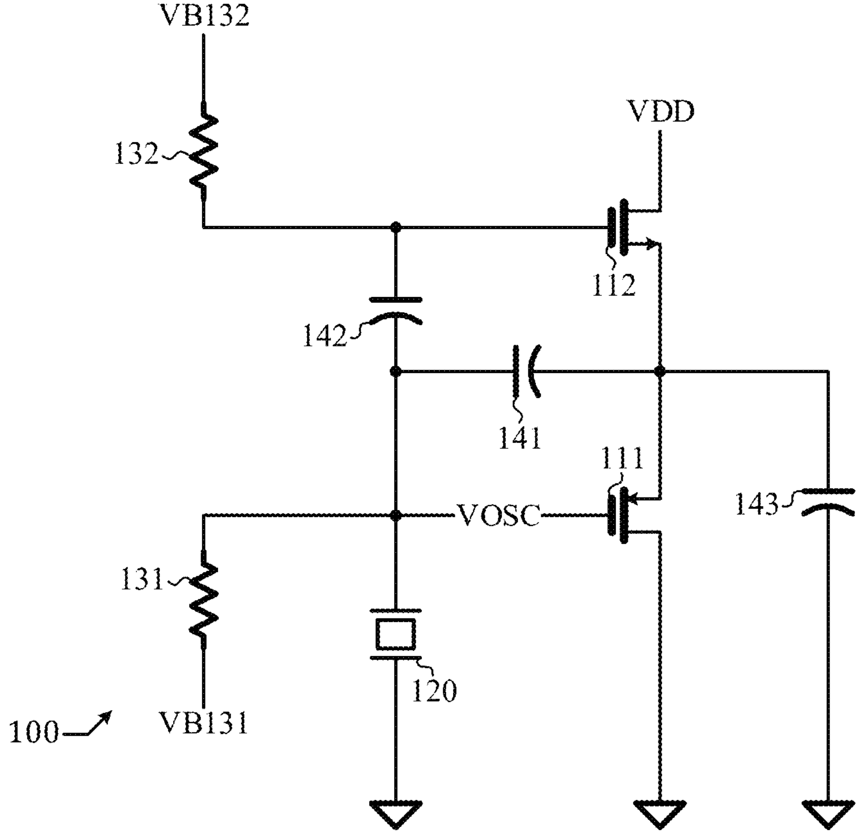
FIG. 1 shows a schematic diagram of a prior art crystal oscillator.

The present disclosure is directed to crystal oscillator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons having ordinary skill in the art are familiar with terms and basic concepts related to microelectronics as used in this disclosure, such as "voltage," "signal," "logical signal," "clock," "source follower," "oscillator," "bias," "AC (alternating current)," "DC (direct current)" "power supply," "ground," "resistor," "capacitor," "impedance,' "CMOS (complementary metal-oxide semiconductor)," "NMOS (n-channel metal-oxide semiconductor) transistor," and "PMOS (p-channel metal-oxide semiconductor) transistor." These terms are used within the context of microelectronics, and the associated concepts are apparent to those skilled in the art, thereby obviating the need for a detailed explanation herein.

Those skilled in the art will recognize the symbol for a MOS (metal-oxide semiconductor) transistor and will be able to identify the "source," "gate," and "drain" terminals associated with both PMOS (p-channel metal-oxide semiconductor) and NMOS (n-channel metal-oxide semiconductor) transistors. For the sake of brevity, the terms "source terminal," "gate terminal," and "drain terminal" may be referred to as "source," "gate," and "drain," respectively, and it should be understood from the context without causing confusion. Those skilled in the art will understand circuit schematics comprising PMOS and/or NMOS transistors without needing a detailed description of the interconnections between components in such schematics.

A MOS transistor, whether PMOS or NMOS, is said to be configured in a diode-connected topology when its gate is electrically connected to its drain terminal.

A MOS transistor has a threshold voltage; when a gate-to-source voltage is smaller than the threshold voltage, the MOS transistor is non-conductive.

This present disclosure is described from an engineering standpoint. For example, with reference to two variables, X and Y, when it is stated that "X is equal to Y," it signifies that "X is approximately equal to Y," denoting that "a difference between X and Y is within a specified engineering tolerance." Similarly, when it is asserted that "X is zero," it implies that "X is approximately zero," meaning that "X is within a specified engineering tolerance." The expression "X is substantially smaller than Y" denotes that "X is negligible with respect to Y," indicating that "the ratio between X and Y is within a specified engineering tolerance, thereby rendering X negligible in comparison to Y."

A "power supply node" is herein defined as a circuit node possessing a voltage that is substantially equal to a power supply voltage, which is greater than zero but may exhibit minor high-frequency fluctuations. Conversely, a "ground node" is a circuit node maintaining a voltage that is substantially zero, albeit with potential minor high-frequency fluctuations. Throughout this disclosure, the term "VDD" shall represent a power supply node, whereas a ground symbol, which can be readily identified by those of ordinary skill in the art, shall denote a ground node.

Figure 2:
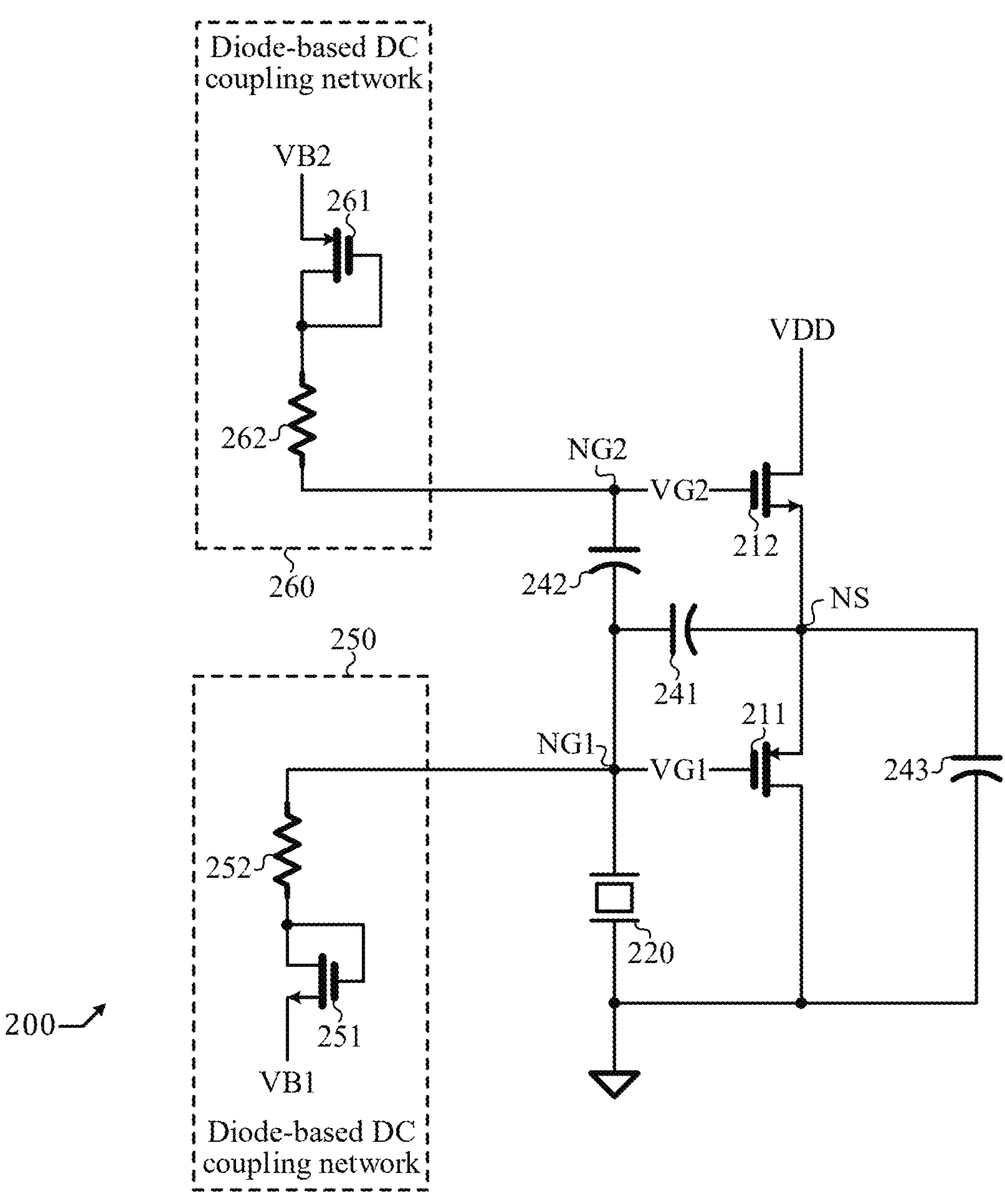
FIG. 2 shows a schematic diagram of a crystal oscillator in accordance with an embodiment of the present disclosure.

As illustrated in FIG. 2, a crystal oscillator 200, in accordance with an embodiment of the present invention, comprises: a crystal 220 positioned between a first gate node NG1 and a ground node; a PMOS transistor 211 having its gate, source, and drain terminals connected to the first gate node NG1, a source node NS, and the ground node, respectively; an NMOS transistor 212 having its gate, source, and drain terminals connected to a second gate node NG2, the source node NS, and a power supply node VDD, respectively; a feedback capacitor 241 positioned between the first gate node NG1 and the source node NS; a shunt capacitor 243 positioned between the source node NS and the ground node; an AC (alternating current) coupling capacitor 242 positioned between the first gate node NG1 and the second gate node NG2; a first diode-based DC (direct current) coupling network 250 configured to couple a first bias node VB1 to the first gate node NG1; and a second diode-based DC coupling network 260 configured to couple a second bias node VB2 to the second gate node NG2.

Both the first bias node VB1 and the second bias node VB2 are characterized by having low impedance, thereby providing well-defined, stable, and steady DC bias voltages. In an embodiment, by way of example but not limitation, the first bias node VB1 is the ground node, and the second bias node VB2 is the power supply node VDD.

A first gate voltage VG1 at the first gate node NG1 is an oscillatory signal having a frequency approximately equal to the resonant frequency of the crystal 220. The PMOS transistor 211 is configured as a source follower, and in conjunction with the feedback capacitor 241 and the shunt capacitor 243, forms a regenerative network presenting a negative resistance at the first gate node NG1, thereby sustaining the oscillation of VG1. The NMOS transistor 212 is also configured as a source follower. The AC coupling capacitor 242 ensures that a second gate voltage VG2 at the second gate node NG2 is substantially equal to VG1 with regards to AC aspect. This configuration enables the NMOS transistor 212 and the PMOS transistor 211 to operate coherently, thus enhancing the effectiveness of the source follower function of both transistors.

The crystal oscillator 200 is substantially similar to the prior art crystal oscillator 100 depicted in FIG. 1, with the exception of employing two diode-based DC coupling networks 250 and 260 instead of merely two resistors to provide DC coupling of two bias voltages to the PMOS transistor 211 and the NMOS transistor 212, respectively. The first diode-based DC coupling network 250 comprises a first resistor 252 and a diode-connected NMOS transistor 251 having a source terminal connected to the first bias node VB1, a drain terminal coupled to the first gate node NG1 via the first resistor 252, and a gate terminal connected to the drain terminal. Similarly, the second diode-based DC coupling network 260 comprises a second resistor 262 and a diode-connected PMOS transistor 261 having a source terminal connected to the second bias node VB2, a drain terminal coupled to the second gate node NG2 via the second resistor 262, and a gate terminal connected to the drain terminal.

The implementation of diode-based DC coupling networks for establishing bias conditions provides a low-noise advantage. The NMOS transistor 251 is substantially non-conductive when the first gate voltage VG1 at the first gate node NG1 is below a certain voltage level related to a threshold voltage of the NMOS transistor 251. For instance, if VB1 is the ground node and VG1 oscillates between −1V and 1V and the threshold voltage of NMOS transistor 251 is 0.6V, the diode-based DC coupling network 250 remains substantially non-conductive during the interval when VG1 is between −1V and 0.6V and exhibits a resistance approximately equal to the resistance of the first resistor 252 when VG1 is between 0.6V and 1V. Thus, the noise contribution from DC coupling is significantly reduced compared to the prior art where simply a resistor is utilized. The same principle applies to the diode-based DC coupling network 260, wherein it remains substantially non-conductive when a second gate voltage VG2 at the second gate node NG2 is above a certain voltage level related to a threshold voltage of the PMOS transistor 261.

Various modifications, adaptations, and alternative embodiments may be employed to replace the specific embodiments of the two diode-based DC coupling networks 250 and 260 illustrated in FIG. 2. For example, the diode-connected NMOS transistor 251 may be substituted with a diode-connected PMOS transistor; the first resistor 252 and the diode-connected NMOS transistor 251 may be interchanged in position, such that the source of NMOS transistor 251 connects to VB1 via the first resistor 252 and the drain of the NMOS transistor 251 directly connects to NG1; the first resistor 252 may be repositioned between the drain and the gate of NMOS transistor 251, while the gate of NMOS transistor 251 directly connects to NG1; and others. Regardless of the specific configuration, two objectives must be satisfied. First, the DC coupling must be provided such that, under static conditions, the bias voltages at the two bias nodes VB1 and VB2 can be coupled to the gates of PMOS transistor 211 and NMOS transistor 212, respectively, thereby establishing a bias condition. Second, under dynamic conditions when the crystal oscillator 200 is oscillating, the DC coupling networks must be effectively non-conductive during a significant portion of the oscillation period in accordance with a timing of the oscillation, thus minimizing noise contributions from the DC coupling. In summary, DC coupling for biasing is conducted in a self-timed intermittent manner that is synchronized to the oscillation to greatly reduce noise contribution.

Although in FIG. 2, it is shown that the crystal 220 is positioned between the first gate node NG1 and the ground node, it should be understood that positioning the crystal 220 between the first gate node NG1 and the power supply node VDD is equally feasible. This is because the power supply node VDD, being considered an "AC ground," functions equivalently to the ground node with respect to AC aspects. Likewise, positioning the shunt capacitor 243 between the source node NS and the power supply node VDD is functionally equivalent to positioning the shunt capacitor 243 between the source node NS and the ground node.

Positioning the feedback capacitor 241 between the second gate node NG2 and the source node NS is functionally equivalent to positioning the feedback capacitor 241 between the first gate node NG1 and the source node NS. This equivalency arises due to the AC coupling capacitor 242 effectively coupling the first gate node NG1 and the second gate node NG2, rendering them substantially identical with respect to AC characteristics. Furthermore, it is equally feasible to position the crystal 220 between the second gate node NG2 and the ground node as it is to position the crystal 220 between the first gate node NG1 and the ground node. In fact, the crystal 220 may be positioned between one of the first gate node NG1 and the second gate node NG2 and one of the ground node and the power supply node VDD; these four possible configurations are functionally equivalent.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A crystal oscillator comprising:

a PMOS (p-channel semiconductor) transistor having its gate, source, and drain terminals connected to a first gate node, a source node, and a ground node, respectively;

an NMOS (n-channel metal-oxide semiconductor) transistor having its gate, source, and drain terminals connected to a second gate node, the source node, and a power supply node, respectively;

a feedback capacitor positioned between the source node and one of the first gate node and the second gate node;

a shunt capacitor positioned between the source node and one of the power supply node and the ground node;

an AC (alternating current) coupling capacitor positioned between the first gate node and the second gate node;

a crystal positioned between one of the first gate node and the second gate node and one of the ground node and the power supply node;

a first DC (direct current) coupling network configured to couple a first bias node to the first gate node in accordance with a state of a first gate voltage at the first gate node; and a second DC coupling network configured to couple a second bias node to the second gate node in accordance with a state of a second gate voltage at the second gate node, wherein:

both the first bias node and the second bias node are configured with an impedance that results in stable, and steady DC bias voltages;

the first DC coupling network is substantially non-conductive when the first gate voltage is below a certain voltage level; and the first DC coupling network comprises a diode-connected MOS (metal-oxide semiconductor) transistor and a resistor and the certain voltage level is determined by a threshold voltage of the diode-connected MOS transistor;

wherein the second DC coupling network is substantially non-conductive when the second gate voltage is above a certain voltage level;

wherein the second DC coupling network comprises a diode-connected MOS (metal-oxide semiconductor) transistor and a resistor and the certain voltage level is determined by a threshold voltage of the diode-connected MOS transistor.

2. The crystal oscillator of claim 1, wherein the resistor of the first DC coupling network is series connected between the second gate node and the gate/drain connection of the diode-connected MOS transistor of the first DC coupling network.

3. The crystal oscillator of claim 1, wherein the resistor of the second DC coupling network is series connected between the first gate node and the gate/drain connection of the diode-connected MOS transistor of the second DC coupling network.

* * * * *